(12) United States Patent
Asayeh

(10) Patent No.: US 6,794,897 B2
(45) Date of Patent: *Sep. 21, 2004

(54) HIGH DENSITY ANTIFUSE BASED PARTITIONED FPGA ARCHITECTURE

(75) Inventor: Reza Asayeh, Menlo Park, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/411,627

(22) Filed: Apr. 11, 2003

(65) Prior Publication Data

US 2003/0201792 A1 Oct. 30, 2003

Related U.S. Application Data

(63) Continuation of application No. 09/153,828, filed on Sep. 15, 1998, now Pat. No. 6,549,035.

(51) Int. Cl.[7] .................... H03K 19/177; H03K 19/173
(52) U.S. Cl. ............................ 326/41; 326/38; 326/47
(58) Field of Search .............................. 326/38–39, 41, 326/44–45, 47, 101

(56) References Cited

U.S. PATENT DOCUMENTS

| | | | | |
|---|---|---|---|---|
| 5,144,166 A | * | 9/1992 | Camarota et al. ............. | 326/41 |
| 5,742,179 A | * | 4/1998 | Sasaki ......................... | 326/39 |
| 6,549,035 B1 | * | 4/2003 | Asayeh ........................ | 326/41 |

FOREIGN PATENT DOCUMENTS

| | | | |
|---|---|---|---|
| EP | 0 323 078 A2 | 7/1989 | ........... H01L/23/52 |
| EP | 0 415 542 A2 | 3/1991 | ......... H03K/19/173 |
| EP | 0 415 542 A3 | 10/1991 | ......... H03K/19/173 |
| EP | 0 489 570 A2 | 6/1992 | ........... G11C/17/18 |
| EP | 0 501 120 A2 | 9/1992 | ......... H01L/23/525 |
| EP | 0 501 120 A3 | 1/1993 | ......... H01L/23/525 |
| EP | 0 489 570 A3 | 6/1993 | ........... G11C/17/18 |
| EP | 0 663 665 A2 | 7/1995 | ............ G11C/7/00 |
| EP | 0 663 669 A2 | 7/1995 | ........... G11C/17/16 |
| EP | 0 671 767 A2 | 9/1995 | ......... H01L/23/525 |
| EP | 0 663 665 A3 | 12/1996 | ............ G11C/7/00 |
| EP | 0 671 767 A3 | 1/1998 | ......... H01L/23/525 |
| EP | 0 663 669 A3 | 5/1998 | ........... G11C/17/16 |
| EP | 0 889 593 A1 | 1/1999 | ......... H03K/19/173 |
| EP | 0 323 078 B1 | 5/2000 | ......... H01L/23/525 |
| EP | 0 663 665 B1 | 12/2001 | ............ G11C/7/00 |
| EP | 0 889 593 B1 | 9/2002 | ......... H03K/19/173 |
| EP | 0 663 669 B1 | 10/2002 | ........... G11C/17/16 |

* cited by examiner

Primary Examiner—James H. Cho
(74) Attorney, Agent, or Firm—Sierra Patent Group, Ltd.

(57) ABSTRACT

An antifuse based FPGA architecture is partitioned into repeatable blocks of logic modules to reduce the programming time of the array and to minimize parasitic capacitance and current leakage in the array. With repeatable blocks the size of the FPGA may be made larger with minimal changes to the architecture. Disposed along the edges of each repeatable block are bidirectional buffer banks for connecting to adjacent blocks and to an interconnect matrix that is connectable to blocks other than adjacent blocks. Disposed at regular intervals in the interconnect matrix are repeater buffers to limit the number of antifuses on a given track of the interconnect matrix, to minimize RC delay, and to avoid violating the Ipeak limit.

27 Claims, 7 Drawing Sheets

HIGH DENSITY ANTIFUSE BASED PARTITIONED FPGA ARCHITECTURE

CROSS-REFERENCE TO RELATED APPLICATION

This is a continuation of U.S. patent application Ser. No. 09/153,828, filed Sep. 15, 1998, now U.S. Pat. No. 6,549,035 issued Apr. 15, 2003.

BACKGROUND OF THE INVENTION

1. Field of the Invention

The present invention relates to an antifuse-based field programmable gate array (FPGA). More particularly, the present invention relates to a partitioned architecture for a high density antifuse based FPGA.

2. The Prior Art

As is well understood by those of ordinary skill in the art, the architecture for an antifuse based FPGA typically includes logic modules which may be configured as logic gates that are connected together to form higher logic functions. The logic modules are connected together by routing conductors, and the connections are made by programming antifuses. As the number of gates included in an antifuse based FPGA increases, there are a number of considerations which place constraints on the size of the FPGA.

As a first consideration, there is a limit on the number of antifuses that are permitted on any given routing conductor due to the amount of leakage current through and the resistive load across unprogrammed antifuses during programming. As a second consideration, due to the capacitive coupling between routing conductors in the FPGA, there is a limit on the amount of peak current that can pass through an antifuse during normal operations. Since the peak current is a function of the programming current which decreases as processes shrink, long capacitive nets of routing conductors with antifuses on them are limited as to the amount of current which they can charge and discharge.

Further, the total fuse leakage during the normal operation of a large antifuse based FPGA can also be quite considerable. It is well understood that the amount of leakage current is a function of the supply voltage and the junction temperatures. For example, a single fuse having a 3.6 volt supply can leak about approximately 5 nano amperes of current at 125° C. As a consequence, in a 10K gate array having approximately 1 million antifuses, a standby current of 5 milliamps is generated, and for a 200K gate array, a standby current of 100 milliamps is possible.

Finally, for large antifuse based arrays, the programming time of the FPGA can also become prohibitively long, having a duration, for example, of up to four hours to program a 50K FPGA, and up to ten hours to program a 200K gate FPGA.

It is, therefore, an object of the present invention to reduce the capacitive coupling between tracks in a large antifuse based FPGA.

It is a further object of the present invention to reduce the programming time in a large antifuse based FPGA.

It is a further object of the present invention to reduce the standby current in a large antifuse based FPGA.

It is yet another object of the present invention to implement an antifuse based architecture for a large FPGA that is repeatable so that it may be scaled to larger arrays.

It is yet another object of the present invention to provide a partitioned antifuse based FPGA.

It is a further object of the present invention to provide a partitioned FPGA with fixed and segmented interconnect routing channels for minimal and predictable routing delay.

BRIEF DESCRIPTION OF THE INVENTION

According to the present invention an antifuse based FPGA architecture is partitioned into repeatable blocks of logic modules to reduce the programming time of the array and to minimize parasitic capacitance and current leakage in the array. Further, by employing repeatable blocks, the size of the FPGA may be made larger with minimal changes to the architecture. Disposed along the edges of each repeatable blocks are interface buffers for connecting to adjacent blocks and to an interconnect matrix that is connectable blocks other than adjacent blocks. Disposed at regular intervals in the interconnect matrix are repeater buffers to limit the number of antifuses on a given track of the interconnect matrix, to minimize RC delay, and to avoid violating the Ipeak limit.

As a further aspect of the present invention, each of the repeatable blocks may have a separate Vpp. Once programming is completed, these separate Vpp's can be employed as separate Vcc's for each of the repeatable blocks so that the voltage level to a particular block can be lowered to minimize standby current when the inputs and outputs of that particular block are not switching.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
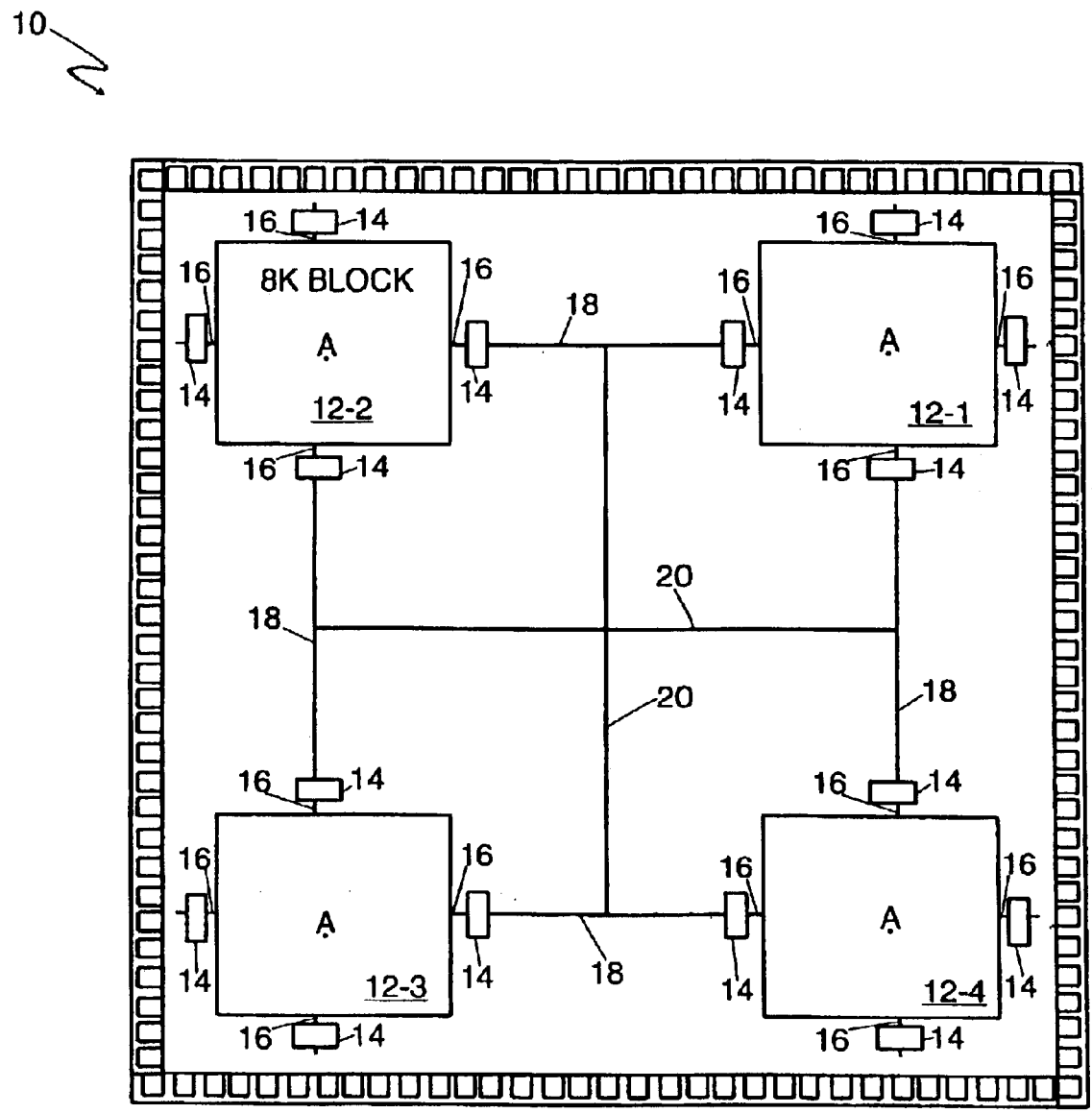
FIG. 1 is a block diagram of a partitioned FPGA 2×2 array architecture according to the present invention.

According to the present invention, FIG. 1 illustrates a partitioned FPGA architecture 10 including four blocks 12-1 through 12-4 of logic function modules laid out in a 2×2 grid pattern, bidirectional buffer banks 14, buffer channels 16, block interconnect channels 18 and routing channels 20. Also accompanying the partitioned FPGA architecture are I/O modules that are not shown to avoid overcomplicating the disclosure and thereby obscuring the present invention. It is presently contemplated that the I/O modules will be preferably disposed along the periphery of the FPGA architecture 10, and will be decoupled from the array. According to design choice the I/O modules can be modified based on the I/O requirements for different applications. For example, the input and output signals of the array blocks 12 can either go to a mini channel structure and then to I/Os, or they can go directly to the I/O modules.

In the FPGA architecture 10, each of the buffer channels 16 is connected between a block 12 and a first side of a bidirectional buffer bank 14. The block interconnect channels 18 are connected between second sides of bidirectional buffer banks 14 of adjacent blocks 12 to form a square configuration. The routing channels 20 are disposed both horizontally and vertically between the blocks 12-1 through 12-4 to form intersections with the block interconnect channels 18. Intersections are also formed between the horizontal and vertical routing channels 20. As will be described in further detail below, disposed at selected ones of these intersections are programmable elements (not shown), preferably antifuses.

In the preferred embodiment, each of the four blocks 12-1 through 12-4 has 8K gates, and the buffer channels 16, block interconnect channels 18 and routing channels 20 each include forty conductors. It should be appreciated, however, that according to the present invention, the number of gates in each of the blocks 12, and the number of conductors in the buffer channels 16, block interconnect channels 18 and routing channels 20 may be either fewer or greater. It should also be appreciated that other programmable elements known to those of ordinary skill in the art such as pass transistors and EEPROMs, etc. may be disposed at the selected intersections referred to above.

According to the present invention, the FPGA architecture 10 provides an interconnect scheme that is easily expandable without introducing any changes to the base array. This will shorten the layout design and verification time. At the same time this interconnect routing scheme should be place and route friendly so it can be developed in minimum time and with a high degree of predictability for software development time.

Figure 2:
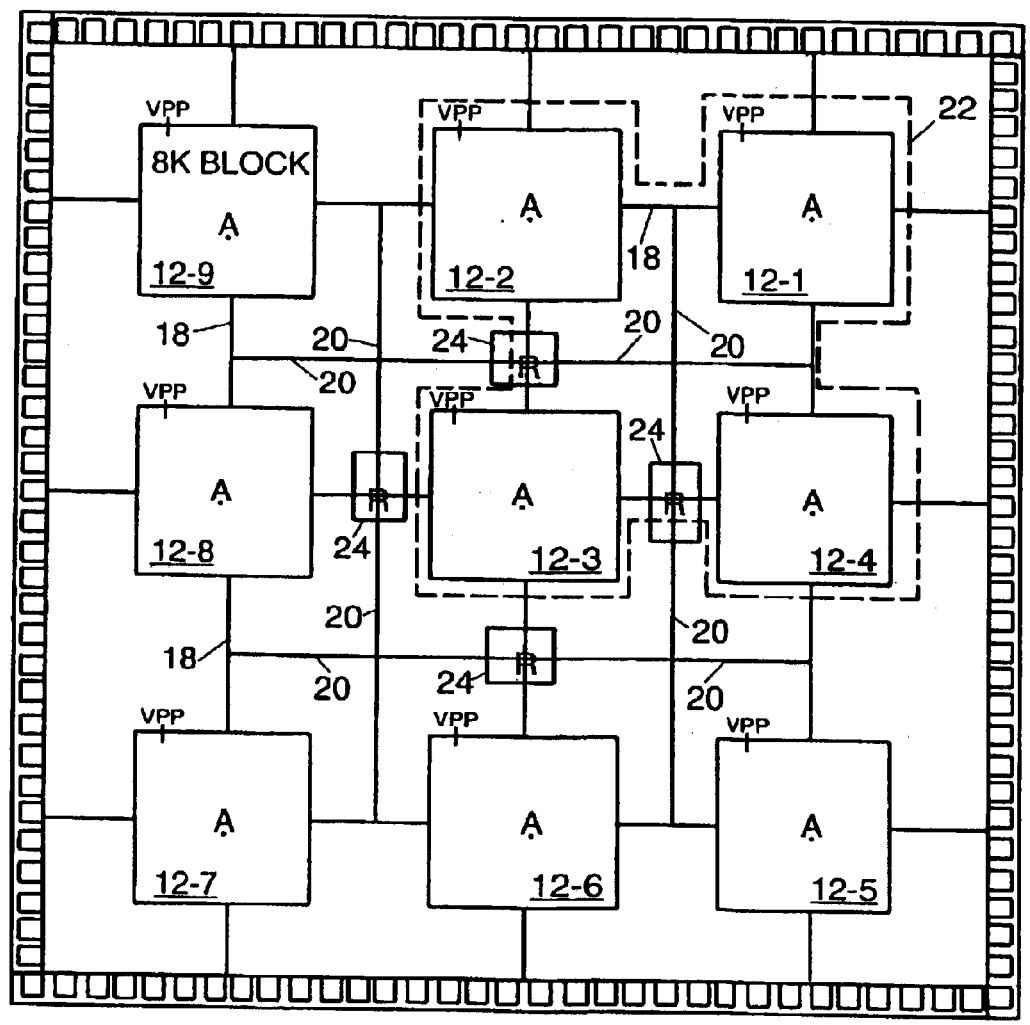
FIG. 2 is a block diagram of a partitioned FPGA architecture as depicted in FIG. 1 that has been expanded with repeater buffers to a 3×3 array according to the present invention.

Turning now to FIG. 2, the partitioned FPGA architecture 10, may be expanded to include more than the four blocks 12-1 through 12-4 of logic modules of FIG. 1 shown within the dashed lines 22 by including repeaters 24 in the routing channels 20. In FIG. 2, a 3x3 array of nine blocks 12 of logic modules is depicted. To avoid overcomplicating the drawing figure, the bidirectional buffer banks 14 are not illustrated.

The modularity of the partitioned FPGA architecture depicted in FIGS. 1 and 2 has numerous advantages. Because each of the array blocks 12 can be independently tested, test development is simplified. With fixed segmentation the verification process can be performed more quickly. Some of the array blocks 12 can be replaced by a RAM blocks or an array block 12 (or a group of 2 or 4 blocks) and their interconnects can easily be replaced by mega functions. The modularity of this architecture simplifies this task. Each array can have a separate local clock, while global clocks can also be incorporated in this architecture.

According to the present invention, the FPGA architecture 10 provides a highly modular and structured design so that product development cycle is minimized. This is achieved by a well defined array used repeatedly, extendable interconnect channels, and an I/O ring that can be independently modified based on particular system requirements.

Figure 3:
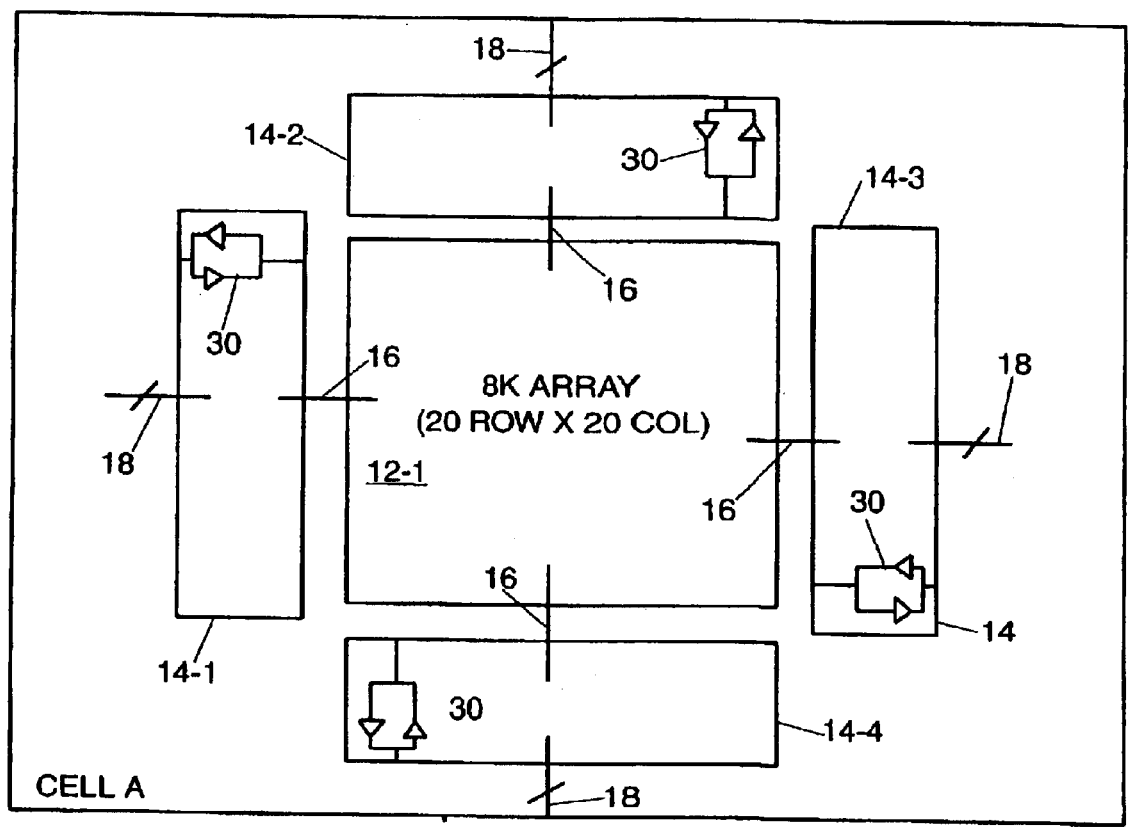
FIG. 3 is a block diagram illustrating the connections between an array block and associated bidirectional buffer banks according to the present invention.

Turning now to FIG. 3, an exemplary block 12 is shown to illustrate the connections between a block 12 and its associated bidirectional buffer banks 14-1 through 14-4 in greater detail. The block of modules 12 represents a fixed array of logic modules that has twenty rows and twenty columns. Each of the bidirectional buffers banks 14 comprises tristatable bidirectional buffers 30. In FIG. 3, an exemplary bidirectional buffer 30 is shown in each of the bidirectional buffer banks 14. In an exemplary embodiment, each row is connected to two bidirectional buffers 30 in each of the bidirectional buffer banks 14-1 and 14-3, and each column is connected to two bidirectional buffers 30 in each of the bidirectional buffer banks 14-2 and 14-4 so that each buffer bank includes forty bidirectional buffers 30. The bidirectional buffers 30 are connected to adjacent blocks 12 by block interconnect channels 18 and routing channels 20 in a manner shown in FIG. 1.

Figure 4A:
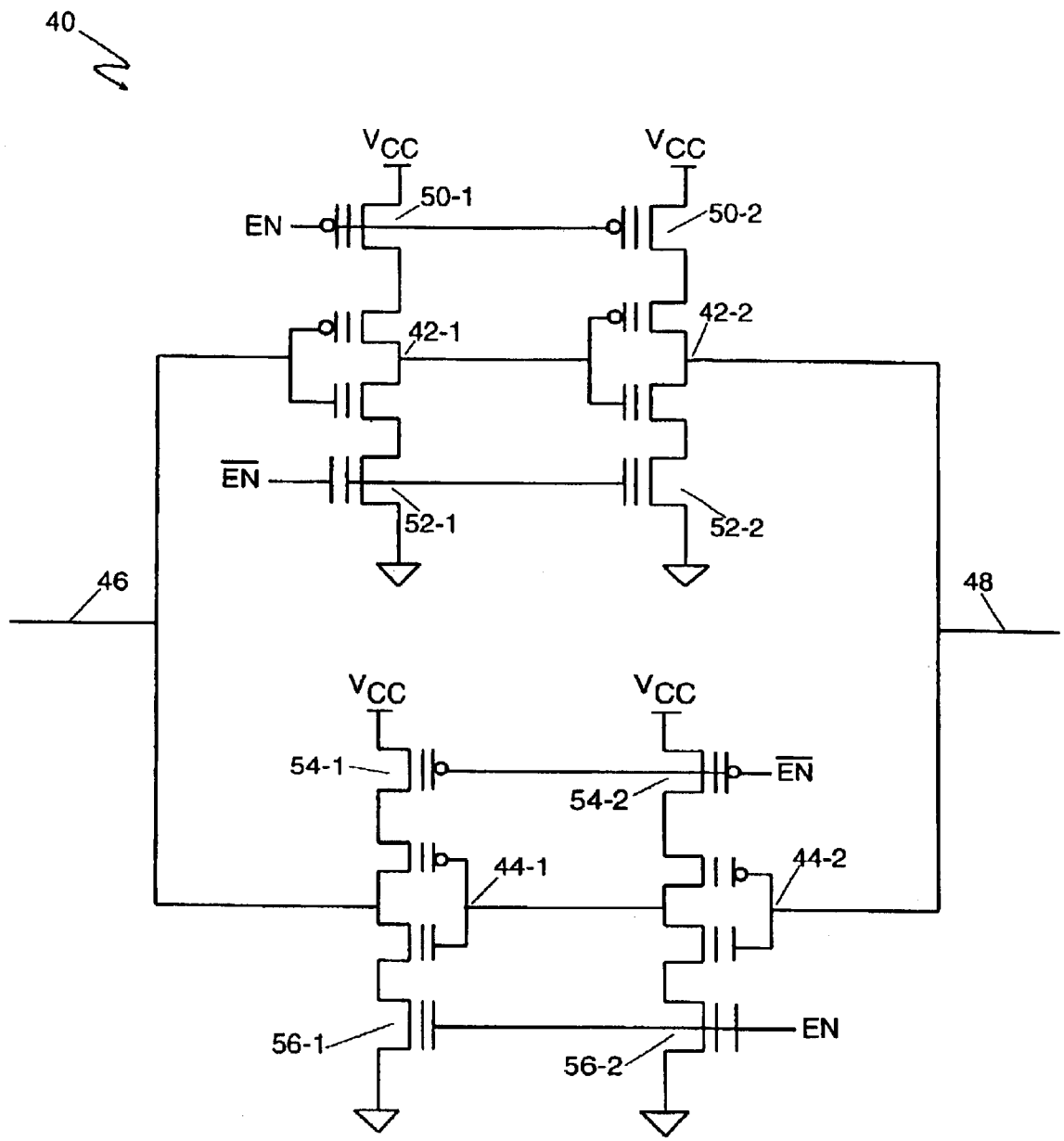
FIGS. 4A and 4B, first and second alternate embodiments of a tristatable bidirectional buffer suitable for use according to the present invention are illustrated.
Figure 4B:
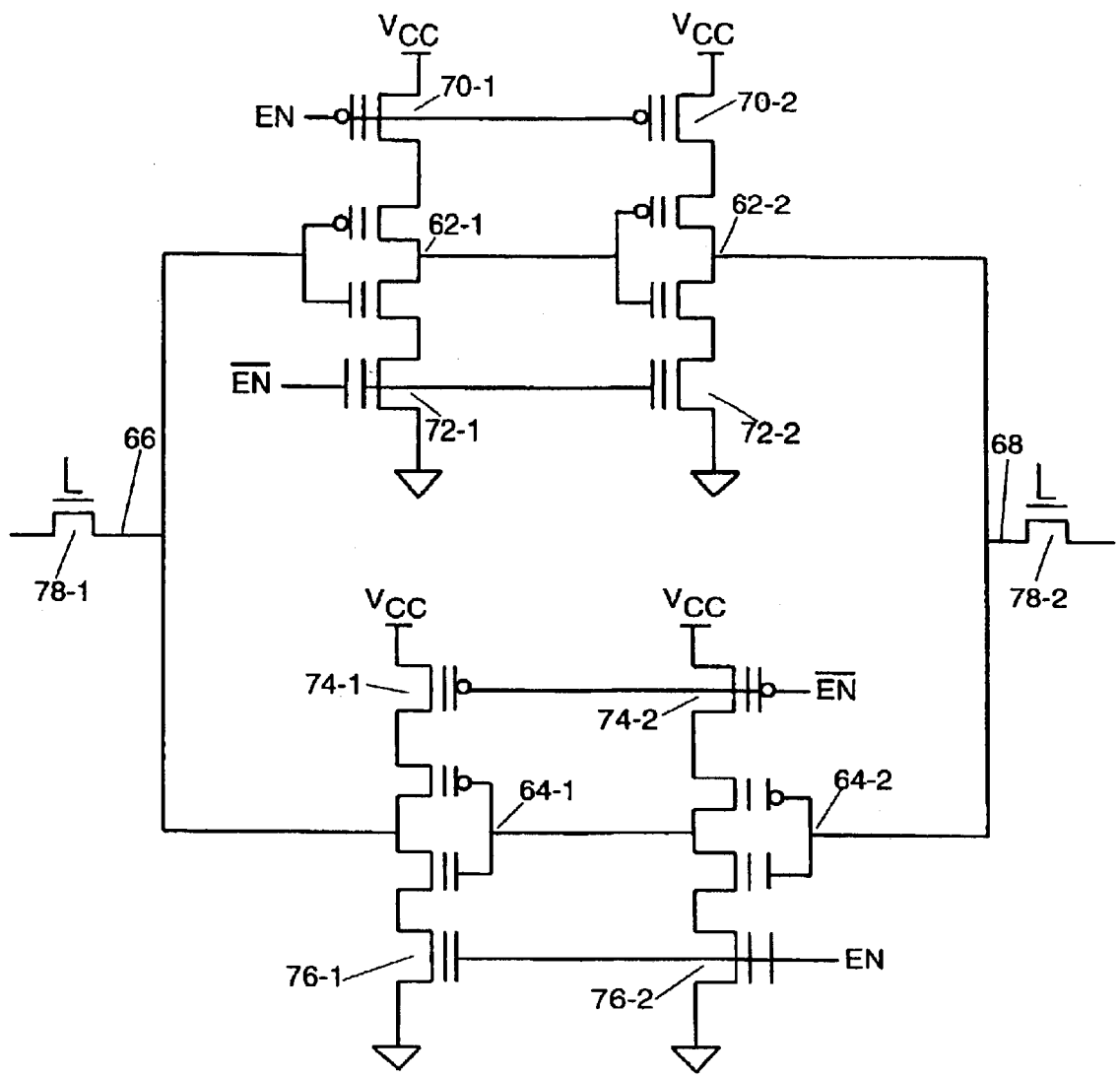

In FIGS. 4A and 4B, first and second alternate embodiments of a tristatable bidirectional buffer 30 suitable for use according to the present invention are illustrated.

In FIG. 4A, a high voltage embodiment of a bidirectional buffer 40 is illustrated. The N-channel and P-channel MOS transistors employed in high voltage bidirectional buffer 40 are large enough to minimize the delay through the bidirectional buffer 40. The bidirectional buffer 40 includes first and second sets of CMOS inverters 42-1, 42-2 and 44-1 and 44-2 implemented in a manner well understood by those of ordinary skill in the art. A first exemplary track of interconnect 46 is connected to the gates of CMOS inverter 42-1, and the common drain connection of CMOS inverter 44-1 on a first side of bidirectional buffer 40. A second exemplary track of interconnect 48 is connected to the gates of CMOS inverter 44-2, and the common drain connection of CMOS inverter 42-2 on a second side of bidirectional buffer 40. The common drain connection of CMOS inverter 42-1 is connected to the gates of CMOS inverter 42-2, and the common drain connection of CMOS inverter 44-2 is connected to the gates of CMOS inverter 44-1.

The ordinary and high impedance states of the bidirectional buffer 40 are controlled by a set of P-channel MOS transistors 50-1, 50-2 and a set of N-channel MOS transistors 52-1, 52-2 connected to CMOS inverters 42-1, 42-2, respectively, and a set of P-channel MOS transistors 54-1, 54-2 and a set of N-channel MOS transistors 56-1, 56-2 connected to CMOS inverters 44-1, 44-2, respectively. The sources of the P-channel MOS transistors in the CMOS inverters 42-1, 42-2, 44-1, and 44-2 are connected to the drains of P-channel MOS transistors 50-1, 50-2, 54-1, and 54-2, respectively, and the sources of the N-channel MOS transistors in the CMOS inverters 42-1, 42-2, 44-1, and 44-2 are connected to the drains of N-channel MOS transistors 52-1, 52-2, 56-1, and 56-2, respectively. The sources of P-channel MOS transistors 50-1, 50-2, 54-1, and 54-2 are coupled to Vcc, and the drains of N-channel MOS transistors 52-1, 52-2, 56-1, and 56-2 are coupled to ground. The gates of the P-channel MOS transistors 50-1 and 50-2, and the gates of the N-channel MOS transistors 56-1 and 56-2 are connected to an enable signal, EN, and the gates of the N-channel MOS transistors 52-1 and 52-2, and the gates of the P-channel MOS transistors 54-1 and 54-2 are connected to the complement of the enable signal, $\overline{EN}$.

In the operation of bidirectional buffer 40, when the EN signal is LOW, the bidirectional buffer 40 will conduct from the interconnect track 46 to the interconnect track 48, but will not conduct from the interconnect track 48 to the interconnect track 46, because the LOW EN signal turns on P-channel MOS transistors 50-1 and 50-2 and N-channel MOS transistors 52-1 and 52-2 to supply Vcc and ground to the sources of the P-channel MOS transistors and N-channel MOS transistors, respectively, in CMOS inverters 42-1 and 42-2. Further, the LOW EN signal turns off P-channel MOS transistors 54-1 and 54-2 and N-channel MOS transistors 56-1 and 56-2. When the EN signal is HIGH, the bidirectional buffer 40 will conduct from the interconnect track 48 to the interconnect track 46, but will not conduct from the interconnect track 46 to the interconnect track 48, because the HIGH EN signal turns on P-channel MOS transistors 54-1 and 54-2 and N-channel MOS transistors 56-1 and 56-2 to supply Vcc and ground to the sources of the P-channel MOS transistors and N-channel MOS transistors, respectively, in CMOS inverters 44-1 and 44-2. Further, the HIGH EN signal turns off P-channel MOS transistors 50-1 and 50-2 and N-channel MOS transistors 52-1 and 52-2.

In FIG. 4B, a low voltage embodiment of a bidirectional buffer 60 is illustrated. The bidirectional buffer 60 is similar to the high voltage bidirectional buffer 40 illustrated in FIG. 4A, except that the N-channel and P-channel MOS transistors employed in the CMOS inverters 62-1, 62-2 and 64-1, 64-2 and the P-channel and N-channel MOS transistors 70-1, 70-2, 74-1, 74-2 and 72-1, 72-2, 76-1, 76-2, respectively, are low voltage devices. To protect these low voltage devices during programming, N-channel MOS pass isolation transistors 78-1 and 78-2 having gates connected to a voltage pump are interposed in first and second exemplary track 66 and 68, respectively, connected to first and second sides of bidirectional buffer 60.

Figure 5:
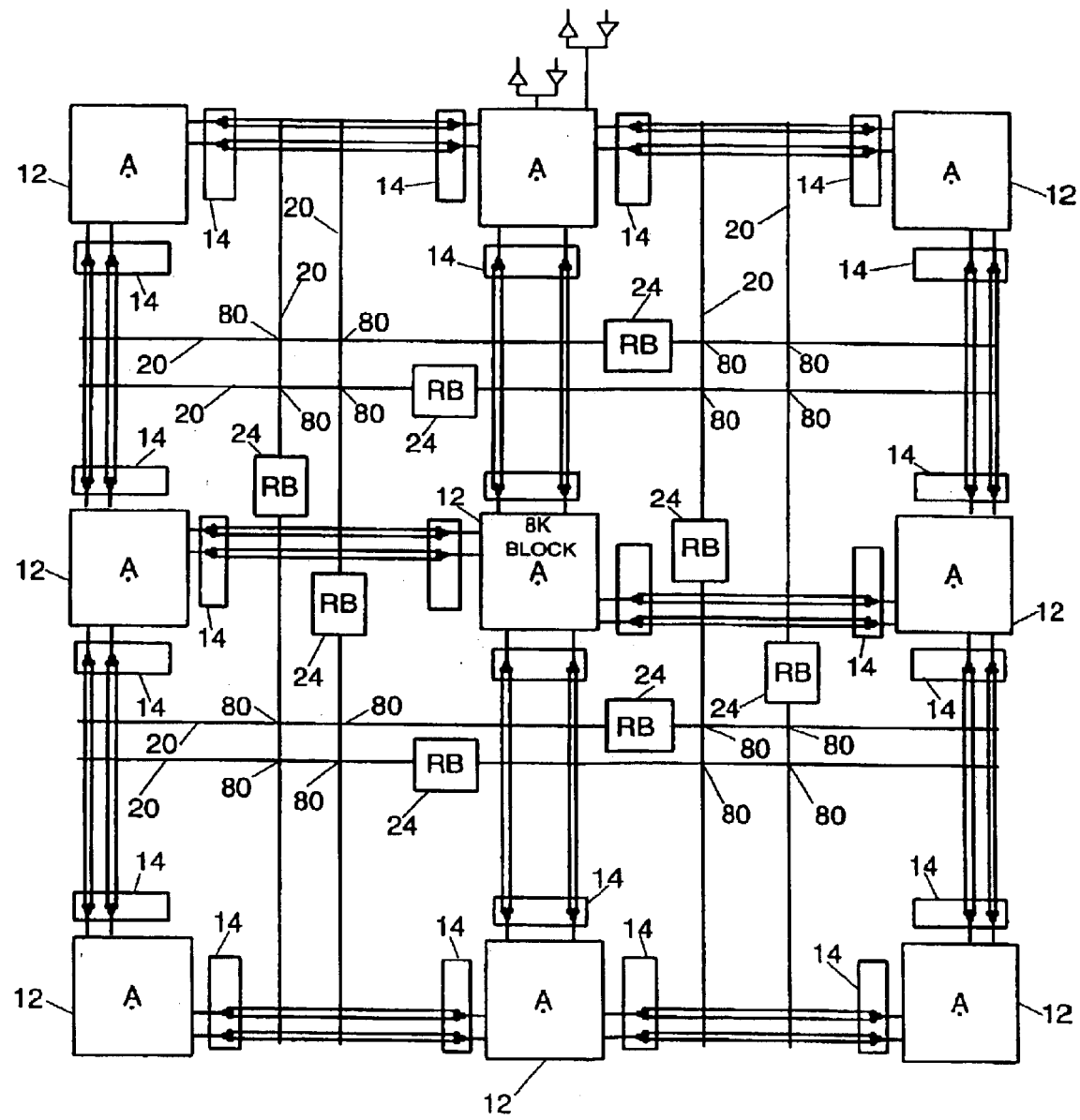
FIG. 5 is a block diagram of the FPGA architecture depicted in FIG. 2 which illustrates the repeater buffers in greater detail according to the present invention.

In FIG. 5, the FPGA architecture including the repeaters 24 depicted in FIG. 2 are shown in greater detail. In FIG. 5 each of the bidirectional buffer banks 14 are depicted with only two exemplary tristatable bidirectional buffers 30 for simplicity. The horizontal and vertical routing conductors 20 form intersections that are populated with programmable elements, preferably antifuses. These programmable elements are represented by the reference numeral 80. It should be appreciated that the routing conductors 20 represent groups of conductors, and that the intersections may be either fully populated with programmable elements or less than fully populated with programmable elements according to design choice. The repeater buffers 24 are included since there are limitations on the $I_{peak}$ limit and the fact that there is a disadvantage to having very long nets with fuses on them.

Further, the maximum number of fuses on each net should be limited to a certain number to avoid cross-coupling and cross-leakage problems during programming. As shown in FIG. 3, the interconnect routing channels connects non adjacent array signals. The repeaters are used within the routing channels 20 to limit the number of fuses on these tracks, minimize and make predictable the RC delay and most importantly make signals fast enough without the violating the $I_{peak}$ limit. The total number of tracks in each of these channels is a matter of design choice. These routing channels also connect signals from diagonally located adjacent blocks 12.

According to the present invention, the FPGA architecture 10 should have high performance since its two major components, the array blocks 12 and interconnect routing between array block 12 are going to be very fast. Also the routing delays are going to be predictable due to the short length of these tracks and the use of the repeater buffers 24. An embodiment of a repeat buffer 24 suitable for use according to the present invention is the same as the bidirectional buffer 60 illustrated in FIG. 4B.

Figure 6:
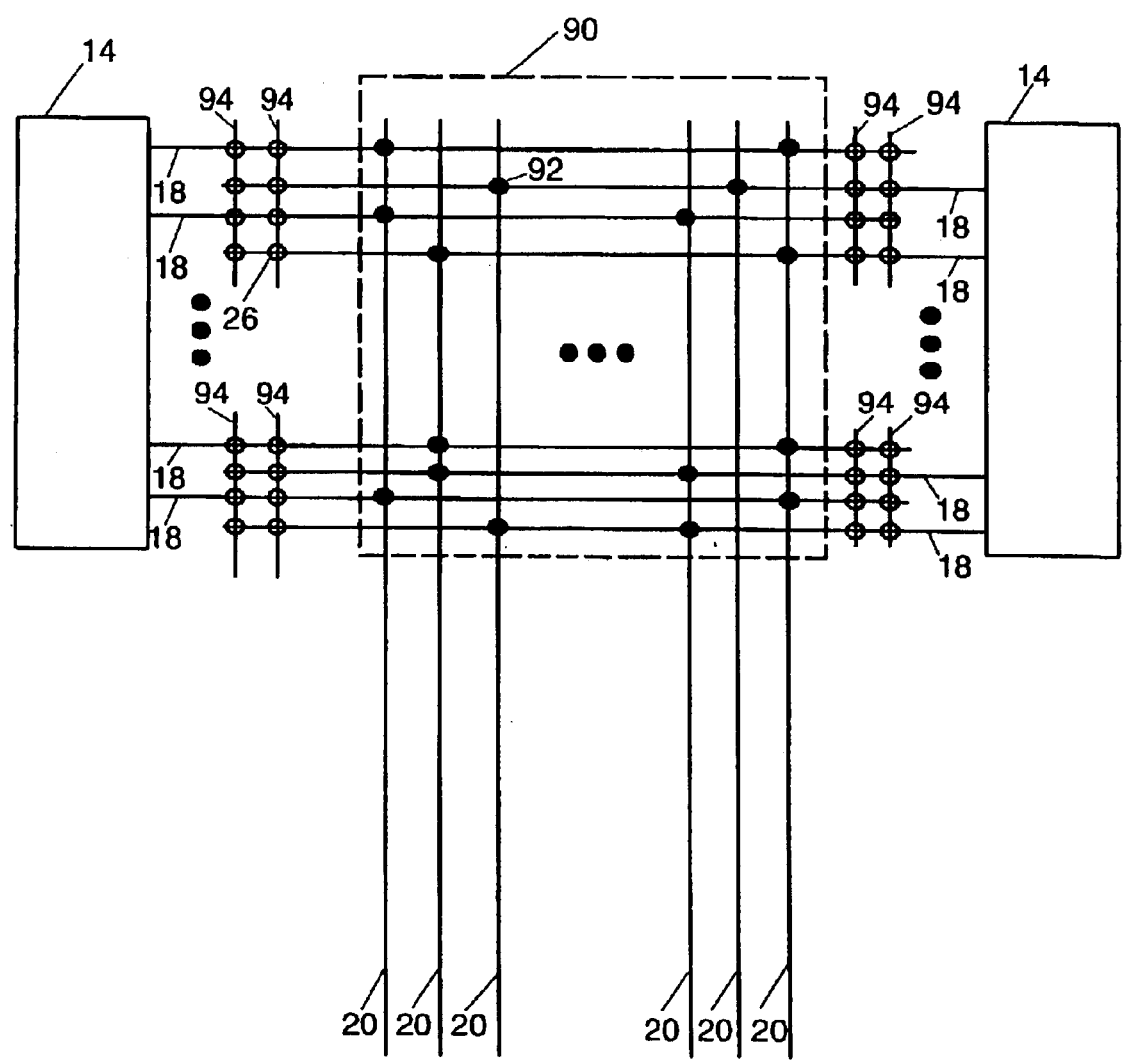
FIG. 6 illustrates the interconnection of the block interconnect channels and the routing channels depicted in FIG. 1 according to the present invention.

Turning now to FIG. 6, the interconnection of the block interconnect channels 18 and routing channels 20 depicted in FIG. 1 is shown in greater detail. The block interconnect channels 18 connected to the bidirectional buffers 30 of a bidirectional buffer bank 14 are preferably segmented conductors that form an interconnect matrix 90 with the routing channels 20. The interconnect matrix 90 will be populated with user-programmable interconnect elements 92 (illustrated as circles), preferably antifuses, at the intersection of the block interconnect channels 18 and the routing channels 20. The population of interconnect elements 92 in the interconnect matrix 90 is for illustration only. As a matter of design choice the interconnect matrix may fully populated or less than fully populated. Also depicted in FIG. 6 are local interconnect conductors 94 that may be alternatively employed to connect adjacent bidirectional buffer banks 14. The intersections of the block interconnect channels 18 and the local interconnect conductors 94 are populated with user-programmable interconnect elements 96 (illustrated as circles), preferably antifuses. The population of interconnect elements 96 may be either fully populated as illustrated or less than fully populated as a matter of design choice.

According to the present invention, either a separate Vpp pad can be used for programming each of the blocks or a very high drive Vpp pad can be branched off internally to each block to provide parallel programming. This Vpp pad will also be used for Vcc once the programming has taken place. When separate pads are employed, the array could be operated at a lower supply voltage during standby mode by sensing the inputs and lowering the Vcc voltage to a block when the inputs are not switching. This would help to lower the standby current due to leakage. Further reduction in the current leakage through an antifuse can be achieved with a migration to lower supply voltages since there is typically a reduction in current leakage by an approximate factor of 10 for every 1 volt reduction and operating voltage.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A partitioned field programmable array architecture comprising:

a plurality of block regions;

a plurality of bidirectional buffer banks, each of said plurality of bidirectional buffer banks coupled on a first side by buffer channels to one of said plurality of block regions, said plurality of bidirectional buffer banks configured to be connected on a second side by block interconnect channels to a second side of another of said plurality of bidirectional buffer banks;

a plurality of routing channels intersecting said block interconnect channels to form a plurality of intersections;

a plurality of user-programmable elements disposed at some of said plurality of intersections, said user-programmable elements configured to provide user-programmable connections between said block interconnect conductors and said routing conductors; and a plurality of repeater buffers disposed serially in said plurality of routing channels.

2. The partitioned field programmable array architecture of claim 1, wherein said plurality of block regions is selected from at least one of the group consisting of logic blocks and RAM blocks.

3. The partitioned field programmable array architecture of claim 1, further comprising:

a local clock disposed in electrical communication with said plurality of block regions.

4. The partitioned field programmable array architecture of claim 1, further comprising:

a global clock disposed in electrical communication with said plurality of block regions.

5. The partitioned field programmable array architecture of claim 1, wherein each of said plurality of block regions has a separate Vpp.

6. The partitioned field programmable array architecture of claim 1, wherein said user-programmable elements are antifuses.

7. The partitioned field programmable array architecture of claim 1, wherein said block interconnect channels are segmented conductors.

8. A partitioned field programmable array architecture comprising:

a plurality of repeatable block regions;

a plurality of bidirectional buffer banks, each of said plurality of bidirectional buffer banks coupled on a first side by buffer channels to one of said plurality of block regions, said plurality of bidirectional buffer banks configured to be connected on a second side by block interconnect channels to a second side of another of said plurality of bidirectional buffer banks;

a plurality of routing channels intersecting said block interconnect channels to form a plurality of intersections;

a plurality of user-programmable elements disposed at some of said plurality of intersections, said user-programmable elements configured to provide user-programmable connections between said block interconnect conductors and said routing conductors; and a plurality of repeater buffers disposed at regular intervals in said plurality of routing channels.

9. The partitioned field programmable array architecture of claim 8, wherein said plurality of block regions is selected from at least one of the group consisting of logic blocks and RAM blocks.

10. The partitioned field programmable array architecture of claim 8, further comprising:

a local clock disposed in electrical communication with said plurality of block regions.

11. The partitioned field programmable array architecture of claim 8, further comprising:

a global clock disposed in electrical communication with said plurality of block regions.

12. The partitioned field programmable array architecture of claim 8, wherein each of said plurality of block regions has a separate Vpp.

13. The partitioned field programmable array architecture of claim 8, wherein said user-programmable elements are antifuses.

14. The partitioned field programmable array architecture of claim 8, wherein said block interconnect channels are segmented conductors.

15. A partitioned field programmable array architecture comprising:

a plurality of repeatable block regions and at least one mega function;

a plurality of bidirectional buffer banks, each of said plurality of bidirectional buffer banks coupled on a first side by buffer channels to one of said plurality of block regions and said at least one mega function, said plurality of bidirectional buffer banks configured to be connected on a second side by block interconnect channels to a second side of another of said plurality of bidirectional buffer banks;

a plurality of routing channels intersecting said block interconnect channels to form a plurality of intersections;

a plurality of user-programmable elements disposed at some of said plurality of intersections, said user-programmable elements configured to provide user-programmable connections between said block interconnect conductors and said routing conductors; and a plurality of repeater buffers disposed at regular intervals in said plurality of routing channels.

16. The partitioned field programmable array architecture of claim 15, wherein said plurality of block regions is selected from at least one of the group consisting of logic blocks and RAM blocks.

17. The partitioned field programmable array architecture of claim 15, further comprising:

a local clock disposed in electrical communication with said plurality of block regions and said at least one mega function.

18. The partitioned field programmable array architecture of claim 15, further comprising:

a global clock disposed in electrical communication with said plurality of block regions and said at least one mega function.

19. The partitioned field programmable array architecture of claim 15, wherein each of said plurality of block regions and said at least one mega function has a separate Vpp.

20. The partitioned field programmable array architecture of claim 15, wherein said user-programmable elements are antifuses.

21. The partitioned field programmable array architecture of claim 15, wherein said block interconnect channels are segmented conductors.

22. A partitioned field programmable array architecture comprising:

a plurality of repeatable block regions;

a plurality of bidirectional buffer banks, each of said plurality of bidirectional buffer banks coupled on a first side by buffer channels to one of said plurality of block regions, said plurality of bidirectional buffer banks configured to be connected on a second side by block interconnect channels to a second side of another of said plurality of bidirectional buffer banks, said block interconnect channels are segmented conductors;

a plurality of routing channels intersecting said block interconnect channels to form a plurality of intersections;

a plurality of user-programmable elements disposed at some of said plurality of intersections, said user-programmable elements configured to provide user-programmable connections between said block interconnect conductors and said routing conductors; and a plurality of repeater buffers disposed at regular intervals in said plurality of routing channels.

23. The partitioned field programmable array architecture of claim 22, wherein said plurality of block regions is selected from at least one of the group consisting of logic blocks and RAM blocks.

24. The partitioned field programmable array architecture of claim 22, further comprising:
   a local clock disposed in electrical communication with said plurality of block regions.

25. The partitioned field programmable array architecture of claim 22, further comprising:
   a global clock disposed in electrical communication with said plurality of block regions.

26. The partitioned field programmable array architecture of claim 22, wherein each of said plurality of block regions has a separate Vpp.

27. The partitioned field programmable array architecture of claim 22, wherein said user-programmable elements are antifuses.

* * * * *

UNITED STATES PATENT AND TRADEMARK OFFICE
CERTIFICATE OF CORRECTION

| | | |
|---|---|---|
| PATENT NO. | : 6,794,897 B2 | Page 1 of 1 |
| APPLICATION NO. | : 10/411627 | |
| DATED | : September 21, 2004 | |
| INVENTOR(S) | : Raza Assveh | |

It is certified that error appears in the above-identified patent and that said Letters Patent is hereby corrected as shown below:

In the Claims

Column 6, Line 58, Claim 1, delete "conductors" and insert -- channels --

Column 6, Line 58, Claim 1, delete "conductors" and insert -- channels --

Signed and Sealed this
Thirtieth Day of September, 2014

Michelle K. Lee
*Deputy Director of the United States Patent and Trademark Office*